(12) United States Patent
Fuentes et al.

(10) Patent No.: US 8,791,501 B1
(45) Date of Patent: Jul. 29, 2014

(54) INTEGRATED PASSIVE DEVICE STRUCTURE AND METHOD

(75) Inventors: Ruben Fuentes, Gilbert, AZ (US); Brett Dunlap, Queen Creek, AZ (US)

(73) Assignee: Amkor Technology, Inc.

( * ) Notice: Subject to any disclaimer, the term of this patent is extended or adjusted under 35 U.S.C. 154(b) by 496 days.

(21) Appl. No.: 12/959,851

(22) Filed: Dec. 3, 2010

(51) Int. Cl.
*H01L 21/00* (2006.01)

(52) U.S. Cl.
USPC .................. 257/154; 257/659; 257/508

(58) Field of Classification Search
USPC .......................... 257/154, 659, 508
See application file for complete search history.

(56) References Cited

U.S. PATENT DOCUMENTS

| | | |
|---|---|---|
| 2,596,993 A | 5/1952 | Gookin |
| 3,435,815 A | 4/1969 | Forcier |
| 3,698,821 A | 10/1972 | Ekstrand |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,194,127 A | 3/1980 | Schmidt |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,394,712 A | 7/1983 | Anthony |
| 4,417,266 A | 11/1983 | Grabbe |
| 4,451,224 A | 5/1984 | Harding |
| 4,499,655 A | 2/1985 | Anthony |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,729,061 A | 3/1988 | Brown |
| 4,737,839 A | 4/1988 | Burt |
| 4,756,080 A | 7/1988 | Thorp, Jr. et al. |
| 4,776,022 A | 10/1988 | Fox et al. |

(Continued)

FOREIGN PATENT DOCUMENTS

| | | |
|---|---|---|
| DE | 197 34 794 | 7/1998 |
| EP | 0 393 997 | 10/1990 |

(Continued)

OTHER PUBLICATIONS

Kim et al., "Application of Through Mold Via (TMV) as PoP base package", 58th ECTC Proceedings, May 2008, Lake Buena Vista, FL, 6 pages, IEEE.

(Continued)

*Primary Examiner* — Laura Menz

(74) *Attorney, Agent, or Firm* — McAndrews, Held & Malloy, Ltd.

(57) ABSTRACT

An integrated passive device (IPD) structure includes an electronic component having an active surface and an opposite inactive surface. The IPD structure further includes a passive device structure extending through the electronic component between the active surface and the inactive surface and having a portion(s) formed on the active surface, the inactive surface, or both the active and inactive surfaces. Accordingly, the IPD structure includes the functionality of the electronic component, e.g., an integrated circuit chip, and of the passive device structure, e.g., one or more capacitors, resistors, inductors, or surface mounted components. By integrating the passive device structure with the electronic component to form the IPD structure, separate mounting of passive component(s) to the substrate is avoided this minimizing the substrate size.

16 Claims, 11 Drawing Sheets

(56) References Cited

U.S. PATENT DOCUMENTS

| | | |
|---|---|---|
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,108,541 A | 4/1992 | Schneider et al. |
| 5,116,459 A | 5/1992 | Kordus et al. |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,181,445 A | 1/1993 | Cothrell |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,229,647 A | 7/1993 | Gnadinger |
| 5,232,505 A | 8/1993 | Novak et al. |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,268,310 A | 12/1993 | Goodrich et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,338,900 A | 8/1994 | Schneider et al. |
| 5,343,076 A | 8/1994 | Katayama et al. |
| 5,353,498 A | 10/1994 | Fillion et al. |
| 5,358,905 A | 10/1994 | Chiu |
| 5,365,106 A | 11/1994 | Watanabe |
| 5,369,431 A | 11/1994 | Levy et al. |
| 5,381,042 A | 1/1995 | Lerner et al. |
| 5,391,439 A | 2/1995 | Tomita et al. |
| 5,394,303 A | 2/1995 | Yamaji |
| 5,406,124 A | 4/1995 | Morita et al. |
| 5,410,180 A | 4/1995 | Fuji et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha |
| 5,432,677 A | 7/1995 | Mowatt et al. |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,506,793 A | 4/1996 | Straayer et al. |
| 5,508,556 A | 4/1996 | Lin |
| 5,517,056 A | 5/1996 | Bigler et al. |
| 5,517,234 A | 5/1996 | Gerber et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,576,517 A | 11/1996 | Wojnarowski et al. |
| 5,578,525 A | 11/1996 | Mizukoshi |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,619,068 A | 4/1997 | Benzoni |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita et al. |
| 5,736,432 A | 4/1998 | Mackessy |
| 5,736,448 A | 4/1998 | Saia et al. |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,769,989 A | 6/1998 | Hoffmeyer et al. |
| 5,770,888 A | 6/1998 | Song et al. |
| 5,776,798 A | 7/1998 | Quan et al. |
| 5,783,861 A | 7/1998 | Son |
| 5,784,484 A | 7/1998 | Umezawa |
| 5,786,238 A | 7/1998 | Pai et al. |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,841,193 A | 11/1998 | Eichelberger |
| 5,844,306 A | 12/1998 | Fujita et al. |
| 5,856,911 A | 1/1999 | Riley |
| 5,859,471 A | 1/1999 | Kuraishi et al. |
| 5,859,475 A | 1/1999 | Freyman et al. |
| 5,866,939 A | 2/1999 | Shin et al. |
| 5,871,782 A | 2/1999 | Choi |
| 5,874,770 A | 2/1999 | Saia et al. |
| 5,874,784 A | 2/1999 | Aoki et al. |
| 5,877,043 A | 3/1999 | Alcoe et al. |
| 5,886,397 A | 3/1999 | Ewer |

(56) References Cited

U.S. PATENT DOCUMENTS

| | | |
|---|---|---|
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,937,324 A | 8/1999 | Abercrombie et al. |
| 5,939,779 A | 8/1999 | Kim |
| 5,942,794 A | 8/1999 | Okumura et al. |
| 5,946,569 A | 8/1999 | Huang |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,982,632 A | 11/1999 | Mosley et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,021,380 A | 2/2000 | Fredriksen et al. |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,035,527 A | 3/2000 | Tamm |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,091,075 A | 7/2000 | Shibata et al. |
| 6,100,594 A | 8/2000 | Fukui et al. |
| 6,113,474 A | 9/2000 | Shih et al. |
| 6,114,752 A | 9/2000 | Huang et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,168,969 B1 * | 1/2001 | Farnworth ............... 438/106 |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,250 B1 | 2/2001 | Melton et al. |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,214,525 B1 | 4/2001 | Boyko et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,192 B1 | 7/2001 | Natarajan |
| 6,258,629 B1 | 7/2001 | Niones et al. |
| 6,261,918 B1 | 7/2001 | So |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,423 B1 | 10/2001 | Lin |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,365,974 B1 | 4/2002 | Abbott et al. |
| 6,369,447 B2 | 4/2002 | Mori |
| 6,369,454 B1 | 4/2002 | Chung |
| 6,373,127 B1 | 4/2002 | Baudouin et al. |
| 6,379,982 B1 | 4/2002 | Ahn et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,396,148 B1 | 5/2002 | Eichelberger et al. |
| 6,396,153 B2 | 5/2002 | Fillion et al. |
| 6,400,004 B1 | 6/2002 | Fan et al. |
| 6,406,934 B1 | 6/2002 | Glenn et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,429,509 B1 | 8/2002 | Hsuan |
| 6,437,429 B1 | 8/2002 | Su et al. |
| 6,444,499 B1 | 9/2002 | Swiss et al. |
| 6,448,633 B1 | 9/2002 | Yee et al. |
| 6,448,661 B1 | 9/2002 | Kim et al. |
| 6,452,279 B2 | 9/2002 | Shimoda |
| 6,459,148 B1 | 10/2002 | Chun-Jen et al. |
| 6,462,107 B1 | 10/2002 | Sinclair et al. |
| 6,464,121 B2 | 10/2002 | Reijnders |
| 6,476,388 B1 | 11/2002 | Nakagaki et al. |
| 6,476,469 B2 | 11/2002 | Hung et al. |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,521,530 B2 * | 2/2003 | Peters et al. ............... 438/667 |
| 6,524,885 B2 | 2/2003 | Pierce |
| 6,534,849 B1 | 3/2003 | Gang |
| 6,545,332 B2 | 4/2003 | Huang |
| 6,545,345 B1 | 4/2003 | Glenn et al. |
| 6,559,525 B2 | 5/2003 | Huang |

(56) References Cited

U.S. PATENT DOCUMENTS

| | | |
|---|---|---|
| 6,566,168 B2 | 5/2003 | Gang |
| 6,573,461 B2 | 6/2003 | Roeters et al. |
| 6,577,013 B1 | 6/2003 | Glenn et al. |
| 6,583,503 B2 | 6/2003 | Akram et al. |
| 6,593,645 B2 | 7/2003 | Shih et al. |
| 6,603,196 B2 | 8/2003 | Lee et al. |
| 6,603,877 B1 | 8/2003 | Bishop |
| 6,608,371 B2 | 8/2003 | Kurashima et al. |
| 6,624,005 B1 | 9/2003 | DiCaprio et al. |
| 6,667,546 B2 | 12/2003 | Huang et al. |
| 6,671,398 B2 | 12/2003 | Reinhorn et al. |
| 6,727,576 B2 | 4/2004 | Hedler et al. |
| 6,730,857 B2 | 5/2004 | Konrad et al. |
| 6,740,964 B2 | 5/2004 | Sasaki |
| 6,780,770 B2 | 8/2004 | Larson |
| 6,831,371 B1 | 12/2004 | Huemoeller et al. |
| 6,838,776 B2 | 1/2005 | Leal et al. |
| 6,845,554 B2 | 1/2005 | Frankowsky et al. |
| 6,853,572 B1 | 2/2005 | Sabharwal |
| 6,869,870 B2 | 3/2005 | Lin |
| 6,872,591 B1 | 3/2005 | Wang et al. |
| 6,873,054 B2 | 3/2005 | Miyazawa et al. |
| 6,905,914 B1 | 6/2005 | Huemoeller et al. |
| 6,919,514 B2 | 7/2005 | Konrad et al. |
| 6,921,975 B2 | 7/2005 | Leal et al. |
| 6,930,256 B1 | 8/2005 | Huemoeller et al. |
| 7,015,075 B2 | 3/2006 | Fay et al. |
| 7,041,534 B2 | 5/2006 | Chao et al. |
| 7,129,158 B2 | 10/2006 | Nakai |
| 7,129,572 B2 * | 10/2006 | Wang ............................ 257/686 |
| 7,151,009 B2 | 12/2006 | Kim et al. |
| 7,190,062 B1 | 3/2007 | Sheridan et al. |
| 7,192,807 B1 | 3/2007 | Huemoeller et al. |
| 7,208,838 B2 | 4/2007 | Masuda |
| 7,223,634 B2 | 5/2007 | Yamaguchi |
| 7,242,081 B1 | 7/2007 | Lee |
| 7,247,523 B1 | 7/2007 | Huemoeller et al. |
| 7,272,444 B2 | 9/2007 | Peterson et al. |
| 7,335,571 B2 | 2/2008 | Rumsey et al. |
| 7,345,361 B2 | 3/2008 | Mallik et al. |
| 7,361,533 B1 | 4/2008 | Huemoeller et al. |
| 7,372,151 B1 | 5/2008 | Fan et al. |
| 7,384,864 B2 | 6/2008 | Lin |
| 7,394,110 B2 * | 7/2008 | Coolbaugh et al. ............ 257/154 |
| 7,396,756 B2 | 7/2008 | Lin |
| 7,420,272 B1 | 9/2008 | Huemoeller et al. |
| 7,420,276 B2 | 9/2008 | Lin et al. |
| 7,553,738 B2 | 6/2009 | Min et al. |
| 7,572,681 B1 | 8/2009 | Huemoeller et al. |
| 7,622,811 B2 | 11/2009 | Chow et al. |
| 7,629,860 B2 | 12/2009 | Liu et al. |
| 7,632,753 B1 | 12/2009 | Rusli et al. |
| 7,692,286 B1 | 4/2010 | Huemoeller et al. |
| 7,714,431 B1 | 5/2010 | Huemoeller et al. |
| 7,714,996 B2 | 5/2010 | Yan et al. |
| 7,723,210 B2 | 5/2010 | Berry et al. |
| 7,741,698 B2 | 6/2010 | Chinthakindi et al. |
| 7,763,954 B2 | 7/2010 | Chinthakindi et al. |
| 7,777,351 B1 | 8/2010 | Berry et al. |
| 7,842,541 B1 * | 11/2010 | Rusli et al. .................... 438/106 |
| 7,843,052 B1 | 11/2010 | Yoo et al. |
| 7,843,072 B1 | 11/2010 | Park et al. |
| 7,902,660 B1 | 3/2011 | Lee et al. |
| 8,337,657 B1 * | 12/2012 | Dunlap et al. ................. 156/247 |
| 2001/0008305 A1 | 7/2001 | McLellan et al. |
| 2001/0011654 A1 | 8/2001 | Schmidt et al. |
| 2001/0012704 A1 | 8/2001 | Eldridge |
| 2001/0014538 A1 | 8/2001 | Kwan et al. |
| 2001/0017694 A1 | 8/2001 | Oomori et al. |
| 2002/0017710 A1 | 2/2002 | Kurashima et al. |
| 2002/0024122 A1 | 2/2002 | Jung et al. |
| 2002/0027297 A1 | 3/2002 | Ikenaga et al. |
| 2002/0061642 A1 | 5/2002 | Haji et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0013232 A1 | 1/2003 | Towle et al. |
| 2003/0030131 A1 | 2/2003 | Lee et al. |
| 2003/0064548 A1 | 4/2003 | Isaak |
| 2003/0073265 A1 | 4/2003 | Hu et al. |
| 2003/0076666 A1 | 4/2003 | Daeche et al. |
| 2003/0134455 A1 | 7/2003 | Cheng et al. |
| 2004/0004293 A1 | 1/2004 | Murayama |
| 2004/0021201 A1 | 2/2004 | Ballantine et al. |
| 2004/0026781 A1 | 2/2004 | Nakai |
| 2004/0043551 A1 | 3/2004 | Beroz |
| 2004/0046244 A1 | 3/2004 | Nakamura et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0104417 A1 | 6/2004 | Song et al. |
| 2004/0113260 A1 | 6/2004 | Sunohara et al. |
| 2004/0120570 A1 | 6/2004 | Levi et al. |
| 2004/0183094 A1 | 9/2004 | Caletka et al. |
| 2004/0192033 A1 | 9/2004 | Hara |
| 2004/0239918 A1 | 12/2004 | Sugihara et al. |
| 2004/0251554 A1 | 12/2004 | Masuda |
| 2005/0046002 A1 | 3/2005 | Lee et al. |
| 2005/0104181 A1 | 5/2005 | Lee et al. |
| 2005/0116337 A1 | 6/2005 | Chua et al. |
| 2005/0194533 A1 | 9/2005 | Okuda et al. |
| 2005/0242425 A1 | 11/2005 | Leal et al. |
| 2005/0282314 A1 | 12/2005 | Lo et al. |
| 2006/0124874 A1 | 6/2006 | Uto et al. |
| 2007/0007639 A1 | 1/2007 | Fukazawa |
| 2007/0206267 A1 | 9/2007 | Tung et al. |
| 2007/0273014 A1 | 11/2007 | Lee et al. |
| 2007/0273049 A1 | 11/2007 | Khan et al. |
| 2007/0290376 A1 | 12/2007 | Zhao et al. |
| 2008/0003414 A1 | 1/2008 | Magera et al. |
| 2008/0122079 A1 | 5/2008 | Chen et al. |
| 2008/0136041 A1 | 6/2008 | Kotake et al. |
| 2008/0225283 A1 | 9/2008 | Chi et al. |
| 2008/0230887 A1 | 9/2008 | Sun et al. |
| 2009/0020865 A1 | 1/2009 | Su |
| 2009/0039527 A1 | 2/2009 | Chan et al. |
| 2009/0212407 A1 | 8/2009 | Foster et al. |
| 2009/0229856 A1 | 9/2009 | Fredenberg et al. |

FOREIGN PATENT DOCUMENTS

| | | |
|---|---|---|
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 3/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |

(56) References Cited

FOREIGN PATENT DOCUMENTS

| | | |
|---|---|---|
| JP | 02-129948 | 5/1990 |
| JP | 03-069248 | 7/1991 |
| JP | 03-177060 | 8/1991 |
| JP | 04-098864 | 3/1992 |
| JP | 05-129473 | 5/1993 |
| JP | 05-166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 2000-150765 | 5/2000 |
| JP | 2000-556398 | 10/2000 |
| JP | 2001-060648 | 3/2001 |
| JP | 2002-043497 | 2/2002 |
| KR | 1994-0001979 | 1/1994 |
| KR | 10-0220154 | 6/1999 |
| KR | 2002-0049944 | 6/2002 |
| WO | WO 99/56316 | 11/1999 |
| WO | WO 99/67821 | 12/1999 |

OTHER PUBLICATIONS

Scanlan, "Package-on-package (PoP) with Through-mold Vias", *Advanced Packaging*, Jan. 2008, 3 pages, vol. 17, Issue 1, PennWell Corporation.

Huemoeller et al., "Integrated Circuit Film Substrate Having Embedded Conductive Patterns and Vias", U.S. Appl. No. 10/261,868, filed Oct. 1, 2002.

Berry et al., "Direct-write Wafer Level Chip Scale Package", U.S. Appl. No. 11/289,826, filed Nov. 29, 2005.

Huemoeller et al., "Metal Etch Stop Fabrication Method and Structure", U.S. Appl. No. 11/765,806, filed Jun. 20, 2007.

Huemoeller et al., "Embedded Die Metal Etch Stop Fabrication Method and Structure", U.S. Appl. No. 11/765,828, filed Jun. 20, 2007.

Karim et al., "Embedded Passive Component Network Substrate and Fabrication Method", U.S. Appl. No. 11/924,156, filed Oct. 25, 2007.

Huemoeller et al., "Embedded Electronic Component Package Fabrication Method", U.S. Appl. No. 12/459,532, filed Jul. 2, 2009.

Berry et al., "Direct-Write Wafer Level Chip Scale Package", U.S. Appl. No. 12/661,597, filed Mar. 19, 2010.

Huemoeller et al., "Through Via Nub Reveal Method and Structure", U.S. Appl. No. 12/754,837, filed Apr. 6, 2010.

Hiner et al., "Through Via Connected Backside Embedded Circuit Features Structure and Method", U.S. Appl. No. 12/848,820, filed Aug. 2, 2010.

Do et al., "Semiconductor Device and Manufacturing Method Thereof", U.S. Appl. No. 12/898,192, filed Oct. 5, 2010.

\* cited by examiner

INTEGRATED PASSIVE DEVICE STRUCTURE AND METHOD

TECHNICAL FIELD

The present application relates to the field of electronics, and more particularly, to methods of forming electronic component structures and the related structures.

BACKGROUND

An integrated circuit chip is often used in conjunction with a passive component, e.g., a capacitor, resistor, or inductor. The integrated circuit chip is mounted to a substrate. The passive component is also mounted to the substrate, e.g., using surface mount technology (SMT). The substrate must be of sufficiently large size to accommodate the side-by-side mounting of the integrated circuit chip and the passive component. However, it is desirable to minimize the size of the substrate thus minimizing the size of the resulting structure.

BRIEF DESCRIPTION OF THE DRAWINGS

In the following description, the same or similar elements are labeled with the same or similar reference numbers.

DETAILED DESCRIPTION

Figure 1:
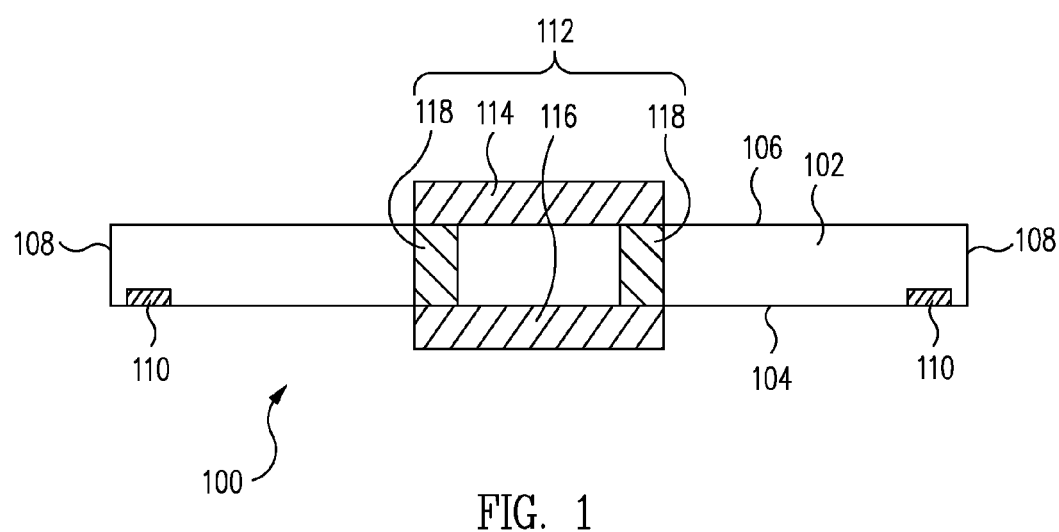
FIG. 1 is a cross-sectional view of an integrated passive device (IPD) structure including a passive device structure in accordance with one embodiment.

As an overview and in accordance with one embodiment, referring to FIG. 1, an integrated passive device (IPD) structure 100 includes an electronic component 102 having an active surface 104 and an opposite inactive surface 106. IPD structure 100 further includes a passive device structure 112 extending through electronic component 102 between active surface 104 and inactive surface 106 and having a portion(s) 114 and/or 116 formed on active surface 104, inactive surface 106, or both active and inactive surfaces 104, 106. Accordingly, IPD structure 100 includes the functionality of electronic component 102, e.g., an integrated circuit chip, and of passive device structure 112, e.g., one or more capacitors, resistors, inductors, or surface mounted components. By integrating passive device structure 112 with electronic component 102 to form IPD structure 100, separate mounting of passive component(s) to the substrate is avoided this minimizing the substrate size.

Now in more detail, FIG. 1 is a cross-sectional view of an integrated passive device (IPD) structure 100 in accordance with one embodiment. IPD structure 100 includes an electronic component 102, e.g., an integrated circuit chip, sometimes called an active component. In accordance with this embodiment, electronic component 102 includes an active surface 104 and an opposite inactive surface 106. Electronic component 102 further includes sides 108 extending perpendicularly between active surface 104 and inactive surface 106.

Active surface 104 includes active devices, e.g., transistors, formed therein. Electronic component 102 further includes active surface bond pads 110 on active surface 104. Active surface bond pads 110 provide the input/output terminals for the active devices of electronic component 102.

IPD structure 100 further includes a passive device structure 112. Passive device structure 112 includes an inactive surface passive device structure 114, an active surface passive device structure 116, and a through electronic component passive device structure 118, sometimes called a first structure 114, a second structure 116, and a third structure 118, respectively.

Generally, inactive surface passive device structure 114 is coupled to inactive surface 106. More particularly, inactive surface passive device structure 114 is formed: (1) directly on inactive surface 106; (2) on or in a dielectric layer on inactive surface 106; (3) or otherwise coupled to inactive surface 106.

Generally, active surface passive device structure 116 is coupled to active surface 104. More particularly, active surface passive device structure 116 is formed: (1) directly on active surface 104; (2) on or in a dielectric layer on active surface 104; (3) or otherwise coupled to active surface 104.

Generally, through electronic component passive device structure 118, sometimes called a through passive device structure, extends through electronic component 102 and between active surface 104 and inactive surface 106. Through electronic component passive device structure 118 is electrically connected to inactive surface passive device structure 114 and/or active surface passive device structure 116.

In one embodiment, inactive surface passive device structure 114, active surface passive device structure 116, and through electronic component passive device structure 118 collectively form passive device structure 112, e.g., one or more capacitors, resistors, inductors, or surface mounted passive components. Stated another way, passive device structure 112 includes a first structure 114 on inactive surface 106, a second structure 116 on active surface 104 and a third structure 118 extending through electronic component 102 between active surface 104 and inactive surface 106.

In another embodiment, passive device structure 112 includes through electronic complement passive device structure 118 and further includes inactive surface passive device structure 114 or active surface passive device structure 116, but not both. Stated another way, passive device structure 112 includes structure 118 extending through electronic component 102 between active surface 104 and inactive surface 106 and further includes a structure 114 on inactive surface 106 or a structure 116 on active surface 104.

In accordance with one embodiment, active surface bond pads 110 provide the input/output terminals for passive device structure 112 although passive device structure 112 includes other input/output terminals in other embodiments as described below, for example, with reference to FIGS. 18 and 19.

In one embodiment, IPD structure 100 is mounted to a substrate, e.g., in a flip chip, wire bond or other configuration as described below, for example, with reference to FIGS. 18 and 19. IPD structure 100 includes the functionality of electronic component 102, e.g., an integrated circuit chip, and of passive device structure 112, e.g., one or more capacitors, resistors, inductors, or surface mounted components. By integrating passive device structure 112 with electronic component 102 to form IPD structure 100, separate mounting of passive component(s) to the substrate is avoided this minimizing the substrate size.

In yet another embodiment, in place of electronic component 102, IPD structure 100 is formed with an interposer. In accordance with this embodiment, electronic component 102 in FIG. 1 is representative of an interposer 102. Illustratively, interposer 102 is a dummy silicon, i.e., a silicon chip without any (having an absence of) active devices, a ceramic, a dielectric film, or other dielectric or semiconducting material. In another embodiment, interposer 102 is an electrically conductive material having one or more dielectric layers to electrically isolate passive device structure 112 from interposer 102.

Interposer 102 includes a first surface 104, an opposite second surface 106, and sides 108. Interposer 102 does not include active surface bond pads 110 in one embodiment.

Passive device structure 112 includes first structure 114, second structure 116, and third structure 118 coupled to interposer 102 as described above in relation to electronic component 102. Generally, both interposer 102 and electronic component 102 form the passive device support structure upon which passive device structure 112 is built.

In the figures and discussion that follow, electronic component 102 is set forth. However, in light of this disclosure, those of skill in the art will understand that the various structures can also be fabricated with an interposer in place of electronic component 102.

Figure 2:
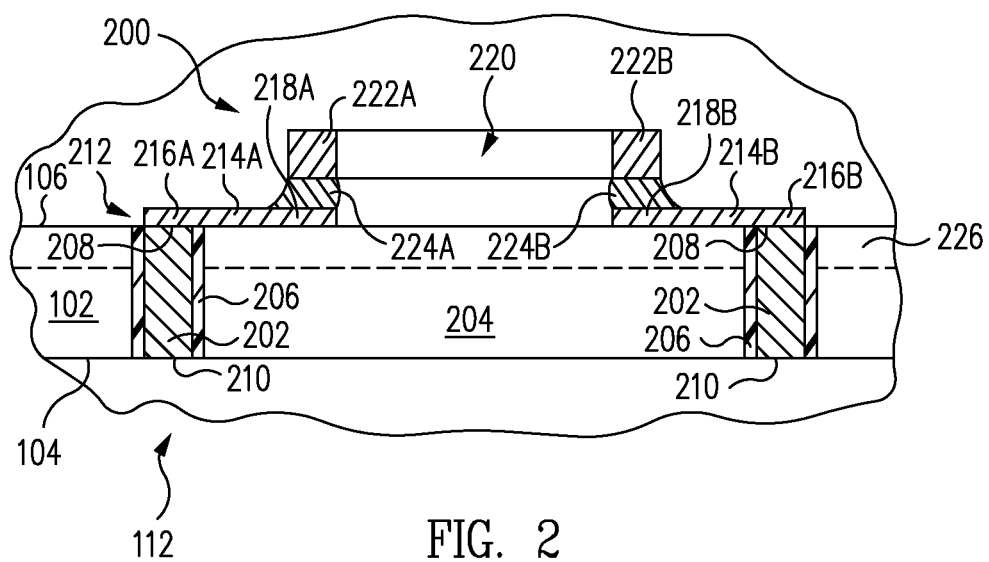
FIG. 2 is a cross-sectional view of a surface mounted component structure of the passive device structure of FIG. 1 in accordance with one embodiment.

FIG. 2 is a cross-sectional view of a surface mounted component structure 200 of passive device structure 112 of FIG. 1 in accordance with one embodiment. Referring now to FIG. 2, surface mounted component structure 200 includes through vias 202, sometimes called Through Silicon Vias (TSVs). Through vias 202 extend through electronic component 102 and between active surface 104 and inactive surface 106.

Through vias 202 are electrically conductive in accordance with this embodiment, e.g., are formed of copper or other electrically conductive material. In accordance with this embodiment, to electrically isolate through vias 202 from the bulk 204, e.g., silicon, of electronic component 102, through vias 202 are enclosed within dielectric sheaths 206, e.g., silicon oxide or other dielectric material. In one embodiment, e.g., where bulk 204 is a dielectric material, sheaths 206 are not formed and thus are optional.

In one embodiment, to form through vias 202 and sheaths 206, via apertures are formed in active surface 104 and extend partially or completely through electronic component 102. The sidewalls, e.g., silicon, of the via apertures are oxidized to form sheaths 206 although sheaths 206 are formed by depositing or otherwise forming a dielectric material in the via apertures in other embodiment.

Sheaths 206, and generally the via apertures, are filled with an electrically conductive material to form through vias 202. If necessary, inactive surface 106 is backgrinded or otherwise removed, e.g., etched, to expose through vias 202 at inactive surface 106. Although one example of the formation of through vias 202 and sheaths 206 is set forth above, in light of this disclosure, those of skill in the art will understand that through vias 202 and sheaths 206 are formed using other techniques in other embodiments.

The ends of through vias 202 are exposed at inactive surface 106 thus forming inactive surface through via terminals 208. Similarly, the ends of through vias 202 are exposed at active surface 104 thus forming active surface through via terminals 210.

IPD structure 100 further includes a circuit pattern 212, sometimes called a metal interconnect, formed on inactive surface 106 and electrically connected to inactive surface through via terminals 208.

Figure 3:
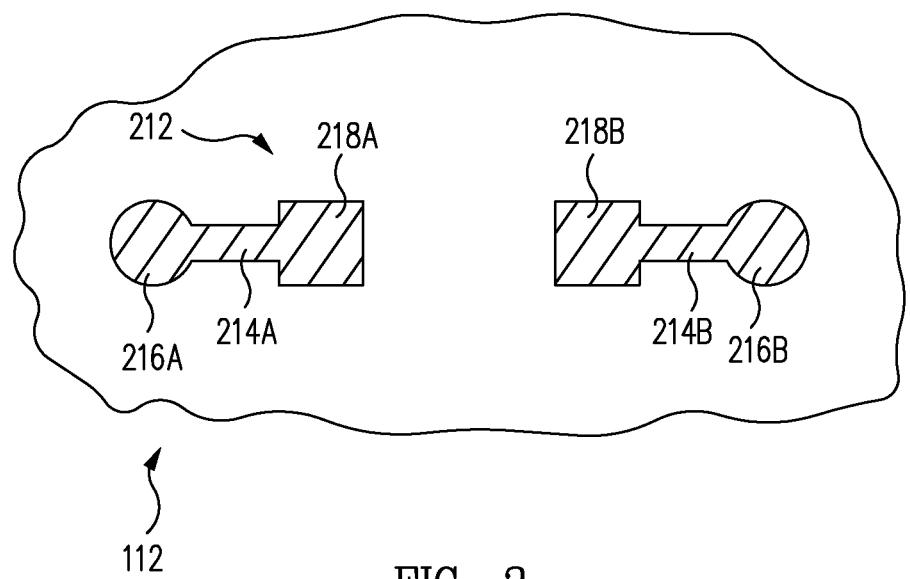
FIG. 3 is a top plan view of a circuit pattern of the surface mounted component structure of FIG. 2 in accordance with one embodiment.

FIG. 3 is a top plan view of circuit pattern 212 of surface mounted component structure 200 of FIG. 2 in accordance with one embodiment. Referring now to FIGS. 2 and 3 together, circuit pattern 212 includes traces 214A, 214B. First ends 216A, 216B of traces 214A, 214B are electrically connected to inactive surface through via terminals 208 of through vias 202. Second ends 218A, 218B of traces 214A, 214B form component lands for mounting of an electronic component 220, e.g., a passive component such as a capacitor, resistor, or inductor. Second ends 218A, 218B are sometimes called component lands 218A, 218B, respectively.

More particular, electronic component 220 includes terminals 222A, 222B. Terminals 222A, 222B are physically and electrically connected to component lands 218A, 218B by electrically conductive joints 224A, 224B, e.g., solder joints, respectively.

Accordingly, electronic component 220 is mounted directly to inactive surface 106 and thus integrated with electronic component 102 to form IPD structure 100. Further, through vias 202 provide an electrically conductive path through electronic component 102 facilitating connection with electronic component 220 at active surface 104, e.g., at active surface through via terminals 210 or a circuit pattern connected thereto.

Although formation of circuit pattern 212 directly on inactive surface 106 is set forth above, in another embodiment, circuit pattern 212 is formed on a dielectric layer 226 (indicated by the dashed line in FIG. 2). In accordance with this embodiment, dielectric layer 226 is formed on inactive surface 106 and through vias 202 extending through dielectric layer 226. Although not illustrated in the following figures or discussed below, in light of this disclosure, those of skill in the art will understand that a dielectric layer similar to dielectric layer 226 can be formed on active surface 104 and/or on inactive surface 106 and the various structures can be formed on or in these dielectric layers instead of directly on active surface 104 and/or on inactive surface 106.

Further, although formation of circuit pattern 212 on inactive surface 106 (or optionally on dielectric layer 226) is set forth above, in another embodiment, circuit pattern 212 is formed on active surface 104 (or optionally on a dielectric layer on active surface 104).

Figure 4:
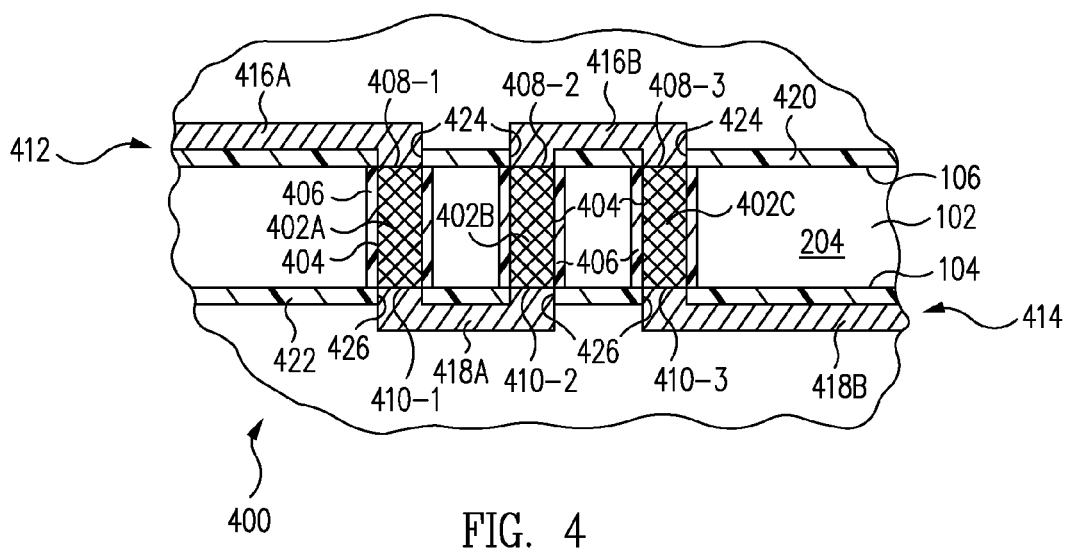
FIG. 4 is a cross-sectional view of a resistor structure of the passive device structure of FIG. 1 in accordance with one embodiment.
Figure 5:
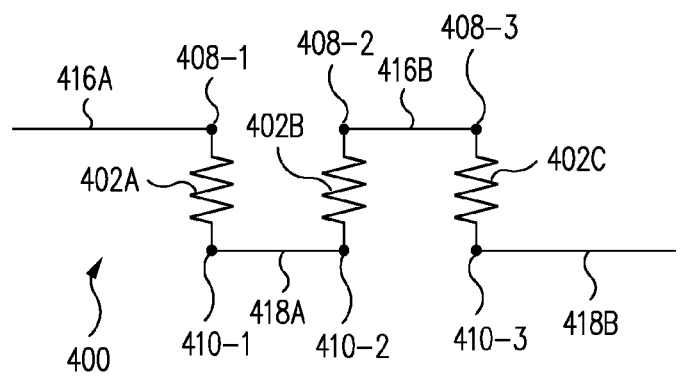
FIG. 5 is a circuit diagram of the resistor structure of FIG. 4 in accordance with one embodiment.

FIG. 4 is a cross-sectional view of a resistor structure 400 of passive device structure 112 of FIG. 1 in accordance with one embodiment. FIG. 5 is a circuit diagram of resistor structure 400 of FIG. 4 in accordance with one embodiment. Referring now to FIGS. 4 and 5 together, resistor structure 400 includes resistors 402A, 402B, 402C connected in series.

More particularly, resistors 402A, 402B, 402C extend entirely through electronic component 102 and between active surface 104 and inactive surface 106. In one embodiment, through via apertures 404, i.e., holes, are formed through electronic component 102 and between active surface 104 and inactive surface 106. Through via apertures 404 are filled with an electrically resistive or conductive material, e.g., the fill material is electrically resistive with a conductive material, to provide resistors 402A, 402B, 402C with a desired resistance. Resistors 402A, 402B, 402C are enclosed within dielectric sheaths 406 to electrically isolate resistors 402A, 402B, 402C from bulk 204 of electronic component 102. In one embodiment, dielectric sheaths 406 are unnecessary and thus not formed.

The ends of resistors 402A, 402B, 402C at inactive surface 106 provide inactive surface resistor terminals 408-1, 408-2, 408-3 of resistors 402A, 402B, 402C, respectively. Similarly, the ends of resistors 402A, 402B, 402C at active surface 104 provide active surface resistor terminals 410-1, 410-2, 410-3 of resistors 402A, 402B, 402C, respectively.

Resistor structure 400 further includes an upper, e.g., first, circuit pattern 412 on inactive surface 106 and a lower, e.g., second, circuit pattern 414 on active surface 104. Circuit patterns 412, 414 connect resistors 402A, 402B, 402C in series.

More particularly, upper circuit pattern 412 includes upper, e.g., first, traces 416A, 416B, collectively upper traces 416. Lower circuit pattern 414 includes lower, e.g., second, traces 418A, 418B, collectively lower traces 418.

Upper trace 416A is connected to inactive surface resistor terminal 408-1 of resistor 402A. Lower trace 418A electrically connects active surface resistor terminals 410-1, 410-2 of resistors 402A, 402B, respectively, together. Upper trace 416B electrically connects inactive surface resistor terminals 408-2, 408-3 of resistors 402B, 402C, respectively, together. Finally, lower trace 418B is connected to active surface resistor terminal 410-3 of resistor 402C.

As illustrated in FIG. 4, optionally, dielectric layers 420, 422 are formed on inactive surface 106 and active surface 104, respectively. Upper traces 416A, 416B are formed on upper dielectric layer 420 and extend through via apertures 424 in upper dielectric layer 420 to inactive surface resistor terminals 408-1, 408-2, 408-3. Similarly, lower traces 418A, 418B are formed on lower dielectric layer 422 and extend through via apertures 426 in lower dielectric layer 422 to active surface resistor terminals 410-1, 410-2, 410-3. Accordingly, dielectric layers 420, 422 electrically isolate traces 416A, 416B, 418A, 418B from surfaces 104, 106 and from each other.

Although resistor structure 400 is illustrated and discussed above as including three resistors 402A, 402B, 402C, in light of this disclosure, those of skill in the art will understand that a similar resistor structure can be formed with more or less than three resistors. For example, a resistor structure can be formed with only a single resistor 402A including upper trace 416A and lower trace 418A. In yet another embodiment, a resistor structure is formed with n number of resistors connected in series similar to resistors 402A, 402B, 402C, wherein n is a number greater than one.

Figure 6:
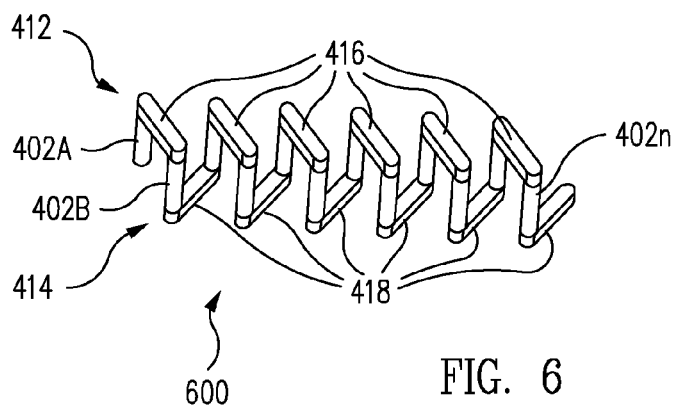
FIG. 6 is a perspective view of a resistor structure of the passive device structure of FIG. 1 in accordance with another embodiment.

FIG. 6 is a perspective view of a resistor structure 600 of passive device structure 112 of FIG. 1 in accordance with another embodiment. Referring now to FIGS. 4 and 6 together, resistor structure 600 of FIG. 6 includes n number of resistors 402A, 402B, . . . , 402n similar to resistors 402A, 402B, 402C of resistor structure 400 of FIG. 4. Resistors 402A, 402B, . . . , 402n are connected in series by circuit patterns 412, 414 including upper traces 416 and lower traces 418. Circuit patterns 412, 414 including upper traces 416 and lower traces 418 of resistor structure 600 of FIG. 6 are similar to circuit patterns 412, 414 including upper traces 416 and lower traces 418 of resistor structure 400 of FIG. 4 and so the description thereof is not repeated here. Further, in FIG. 6, electronic component 102 is not illustrated for clarity of presentation.

Figure 7:
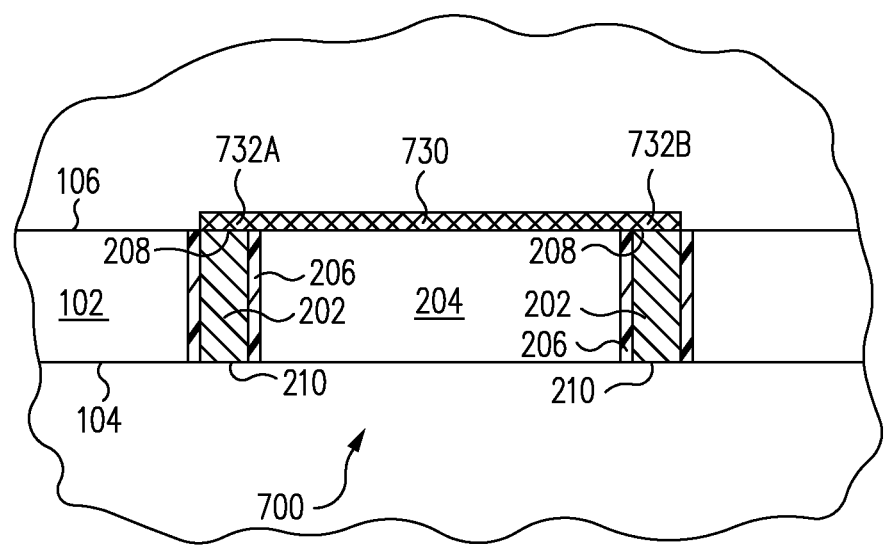
FIG. 7 is a cross-sectional view of a resistor structure of the passive device structure of FIG. 1 in accordance with yet another embodiment.

FIG. 7 is a cross-sectional view of a resistor structure 700 of passive device structure 112 of FIG. 1 in accordance with yet another embodiment. Referring now to FIGS. 2 and 7 together, through vias 202, active surface 104, inactive surface 106, bulk 204, sheaths 206, inactive surface through via terminals 208, and active surface through via terminals 210 of resistor structure 700 of FIG. 7 are similar or identical to through vias 202, active surface 104, inactive surface 106, bulk 204, sheaths 206, inactive surface through via terminals 208, and active surface through via terminals 210 of surface mounted component structure 200 of FIG. 2 and so the description thereof is not repeated here.

Referring now to FIG. 7, resistor structure 700 further includes a resistor 730 formed on inactive surface 106 and electrically connected to inactive surface through via terminals 208. For example, resistor 730 is a thick film resistor formed on inactive surface 106.

Figure 8:
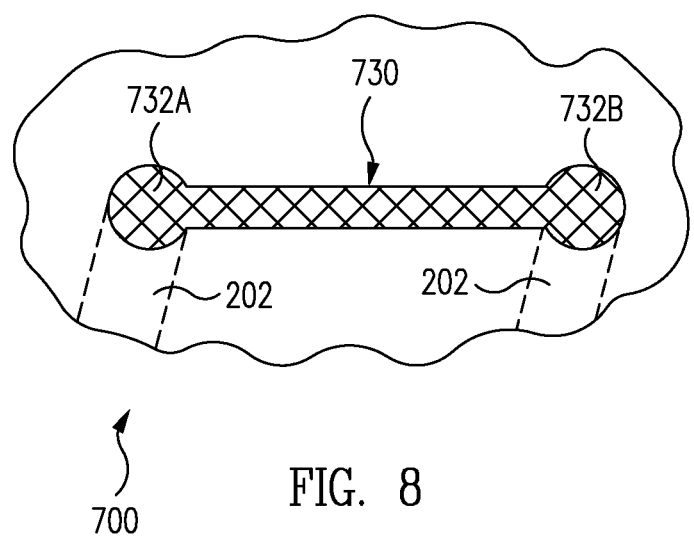
FIG. 8 is a top plan view of the resistor structure of FIG. 7 including a resistor in accordance with one embodiment.

FIG. 8 is a top plan view of resistor structure 700 of FIG. 7 including resistor 730 in accordance with one embodiment. Referring now to FIGS. 7 and 8 together, resistor 730 includes terminals 732A, 732B. Terminals 732A, 732B are electrically connected to inactive surface through via terminals 208. Resistor 730, e.g., a thick film resistor, provides a specified resistance between terminals 732A, 732B.

Further, although formation of resistor 730 on inactive surface 106 (or optionally on a dielectric layer on inactive surface 106) is set forth above, in another embodiment, resistor 730 is formed on active surface 104 (or optionally on a dielectric layer on active surface 104).

Further, although only a single resistor 730 is discussed above, in light of this disclosure, those of skill in the art will understand that more than one resistor 730 can be formed on inactive surface 106 and/or on active surface 104 and connected, e.g., in series or parallel.

Figure 9:
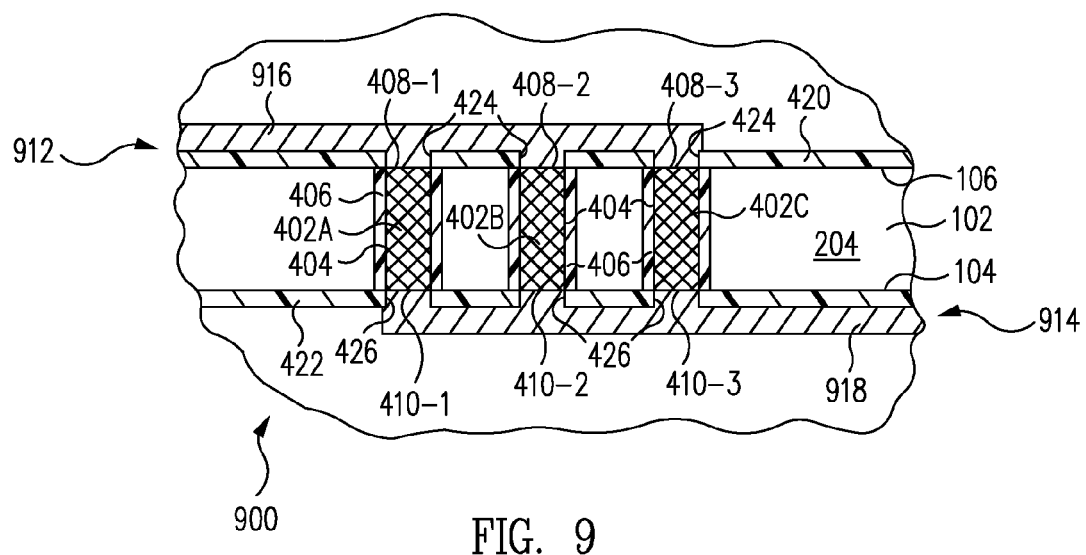
FIG. 9 is a cross-sectional view of a resistor structure of the passive device structure of FIG. 1 in accordance with yet another embodiment.
Figure 10:
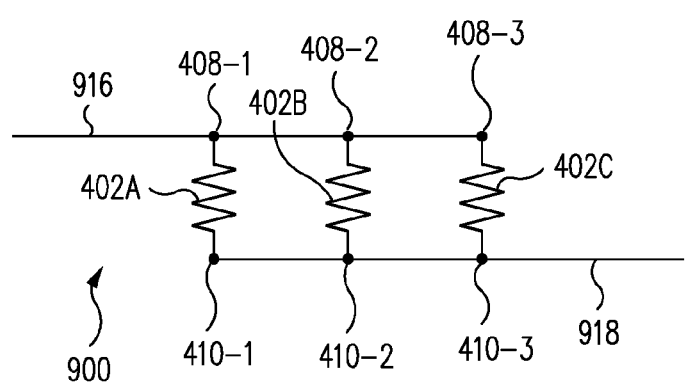
FIG. 10 is a circuit diagram of the resistor structure of FIG. 9 in accordance with one embodiment.

FIG. 9 is a cross-sectional view of a resistor structure 900 of passive device structure 112 of FIG. 1 in accordance with yet another embodiment. FIG. 10 is a circuit diagram of resistor structure 900 of FIG. 9 in accordance with one embodiment. Active surface 104, inactive surface 106, resistors 402A, 402B, 402C, through via apertures 404, sheaths 406, inactive surface resistor terminals 408-1, 408-2, 408-3, bulk 204, active surface resistor terminals 410-1, 410-2, 410-3, upper dielectric layer 420, lower dielectric layer 422, and via apertures 424, 426 of resistor structure 900 of FIG. 9 are similar or identical to active surface 104, inactive surface 106, resistors 402A, 402B, 402C, through via apertures 404, sheaths 406, inactive surface resistor terminals 408-1, 408-2, 408-3, bulk 204, active surface resistor terminals 410-1, 410-2, 410-3, upper dielectric layer 420, lower dielectric layer 422, and via apertures 424, 426 of resistor structure 400 of FIG. 4 and so the description thereof is not repeated here.

Referring now to FIGS. 9 and 10 together, resistors 402A, 402B, 402C are connected in parallel. More particularly, resistor structure 900 includes an upper, e.g., first, circuit pattern 912 on inactive surface 106 and a lower, e.g., second, circuit pattern 914 on active surface 104. Circuit patterns 912, 914 connect resistors 402A, 402B, 402C in parallel.

In accordance with this embodiment, upper circuit pattern 912 includes an upper, e.g., first, trace 916. Lower circuit pattern 914 includes a lower, e.g., second, trace 918.

Upper trace 916 is connected to inactive surface resistor terminals 408-1, 408-2, 408-3 of resistors 402A, 402B, 402C, respectively. Lower trace 918 is connected to active surface resistor terminals 410-1, 410-2, 410-3 of resistors 402A, 402B, 402C, respectively.

As illustrated in FIG. 9, optionally, dielectric layers 420, 422 are formed on inactive surface 106 and active surface 104, respectively. Upper trace 916 is formed on upper dielectric layer 420 and extends through via apertures 424 in upper dielectric layer 420 to inactive surface resistor terminals 408-1, 408-2, 408-3. Similarly, lower trace 918 is formed on lower dielectric layer 422 and extends through via apertures 426 in lower dielectric layer 422 to active surface resistor terminals 410-1, 410-2, 410-3. Accordingly, dielectric layers 420, 422 electrically isolate traces 916, 918 from surfaces 104, 106.

Although resistor structure 900 of FIG. 9 is illustrated and discussed above as including three resistors 402A, 402B, 402C, in light of this disclosure, those of skill in the art will understand that a similar resistor structure can be formed with more or less than three resistors. For example, a resistor structure is formed with n number of resistors connected in parallel similar to resistors 402A, 402B, 402C, wherein n is a number greater than one.

Figure 11:
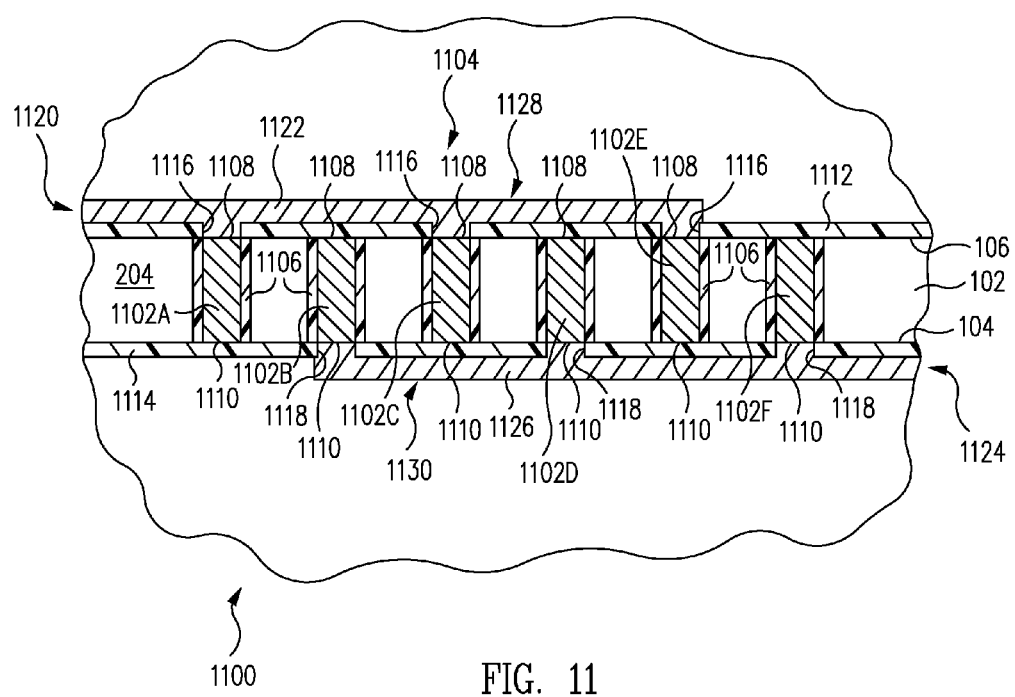
FIG. 11 is a cross-sectional view of a capacitor structure of the passive device structure of FIG. 1 in accordance with one embodiment.

FIG. 11 is a cross-sectional view of a capacitor structure 1100 of passive device structure 112 of FIG. 1 in accordance with one embodiment. Referring now to FIG. 11, capacitor structure 1100 includes through vias 1102A, 1102B, 1102C, 1102D, 1102E, 1102F, collectively referred to as through vias 1102. Through vias 1102 and bulk 204 form a capacitor 1104 in accordance with this embodiment.

Through vias 1102 extend through electronic component 102 and between active surface 104 and inactive surface 106. Through vias 1102 are electrically conductive in accordance with this embodiment, e.g., are formed of copper or other electrically conductive material. In accordance with this embodiment, to electrically isolate through vias 1102 from bulk 204, e.g., silicon, of electronic component 102, through vias 1102 are enclosed within dielectric sheaths 1106, e.g., silicon oxide or other dielectric material.

The ends of through vias 1102 are exposed at inactive surface 106 thus forming inactive surface through via terminals 1108. Similarly, the ends of through vias 1102 are exposed at active surface 104 thus forming active surface through via terminals 1110.

Dielectric layers 1112, 1114 are formed on inactive surface 106 and active surface 104, respectively. Upper dielectric layer 1112 directly contacts, covers, and electrically isolates inactive surface through via terminals 1108 of through vias 1102B, 1102D, 1102F. However, upper dielectric layer 1112 includes via apertures 1116 that expose inactive surface through via terminals 1108 of through vias 1102A, 1102C, 1102E.

Similarly, lower dielectric layer 1114 directly contacts, covers, and electrically isolates active surface through via terminals 1110 of through vias 1102A, 1102C, 1102E. However, lower dielectric layer 1114 includes via apertures 1118 that expose active surface through via terminals 1110 of through vias 1102B, 1102D, 1102F.

Capacitor structure 1100 of FIG. 11 further includes an upper, e.g., first, circuit pattern 1120 on upper dielectric layer 1112 and generally on inactive surface 106. In accordance with this embodiment, upper circuit pattern 1120 includes an upper, e.g., first, trace 1122. Upper trace 1122 is formed on upper dielectric layer 1112 and extends through via apertures 1116 in upper dielectric layer 1112 to inactive surface through via terminals 1108 of through vias 1102A, 1102C, 1102E. As set forth above, upper dielectric layer 1112 electrically isolates upper trace 1122 from inactive surface through via terminals 1108 of through vias 1102B, 1102D, 1102F.

Capacitor structure 1100 of FIG. 11 further includes a lower, e.g., second, circuit pattern 1124 on lower dielectric layer 1114 and generally on active surface 104. In accordance with this embodiment, lower circuit pattern 1124 includes a lower, e.g., first, trace 1126. Lower trace 1126 is formed on lower dielectric layer 1114 and extends through via apertures 1118 in lower dielectric layer 1114 to active surface through via terminals 1110 of through vias 1102B, 1102D, 1102F. As set forth above, lower dielectric layer 1114 electrically isolates lower trace 1126 from active surface through via terminals 1110 of through vias 1102A, 1102C, 1102E.

Accordingly, through vias 1102A, 1102C, 1102E, sometimes called a first set of through vias 1102, are electrically connected together by upper trace 1122. Through vias 1102B, 1102D, 1102F, sometimes called a second set of through vias 1102, are electrically connected together by lower trace 1126. Further through vias 1102A, 1102C, 1102E are electrically isolated from through vias 1102B, 1102D, 1102F by bulk 204/sheaths 1106 thus forming capacitor 1104.

More particularly, through vias 1102A, 1102C, 1102E form a first plate 1128 of capacitor 1104 and through vias 1102B, 1102D, 1102F form a second plate 1130 of capacitor 1104. First plate 1128 is separated from second plate 1130 by bulk 204/sheaths 1106, which form the dielectric material for capacitor 1104 in this embodiment. In one embodiment, through vias 1102A, 1102C, 1102E are interdigitated, e.g., interlocked like the fingers of clasped hands, with through vias 1102B, 1102D, 1102F, as illustrated in FIG. 11.

Although capacitor structure 1100 of FIG. 11 is illustrated and discussed above as including six through vias 1102, in light of this disclosure, those of skill in the art will understand that a similar capacitor can be formed with more or less than six through vias. Those of skill in the art will further understand that the perspective view of capacitor structure 1100 can be of any size or shape.

Figure 12:
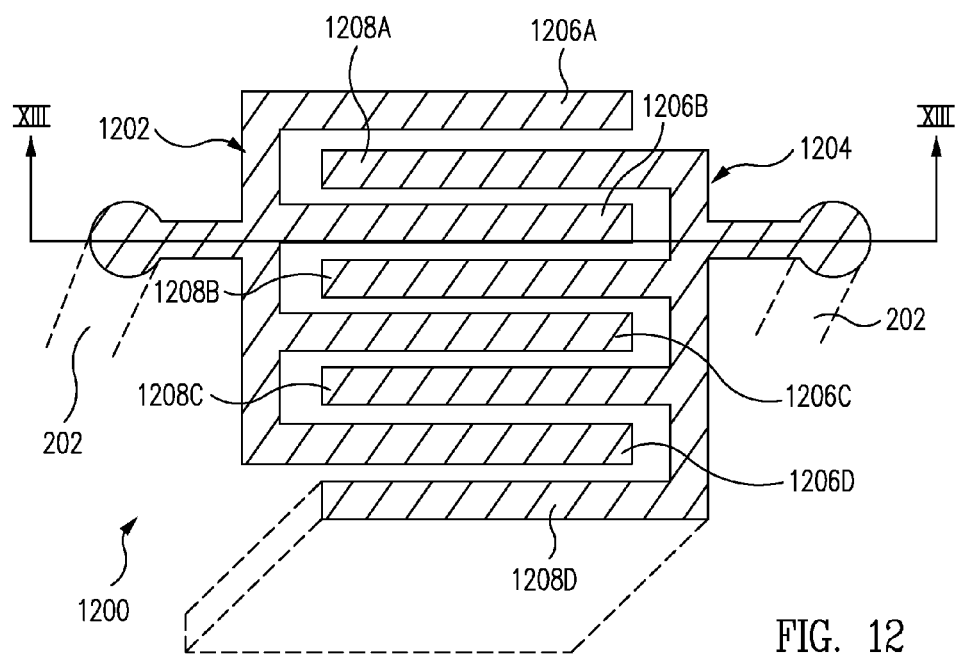
FIG. 12 is a cross-sectional view of a capacitor structure of the passive device structure of FIG. 1 in accordance with another embodiment.
Figure 13:
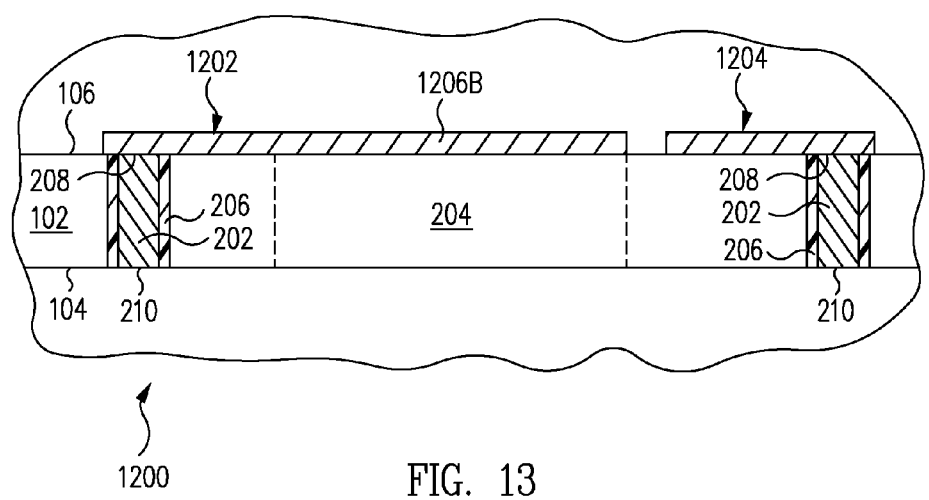
FIG. 13 is a cross-sectional view of the capacitor structure of FIG. 12 along the line XIII-XIII in accordance with one embodiment.

FIG. 12 is a cross-sectional view of a capacitor structure 1200 of passive device structure 112 of FIG. 1 in accordance with another embodiment. FIG. 13 is a cross-sectional view of capacitor structure 1200 of FIG. 12 along the line XIII-XIII in accordance with one embodiment.

Referring now to FIGS. 2, 12, and 13 together, through vias 202, active surface 104, inactive surface 106, bulk 204, sheaths 206, inactive surface through via terminals 208, and active surface through via terminals 210 of capacitor structure 1200 of FIGS. 12, 13 are similar or identical to through vias 202, active surface 104, inactive surface 106, bulk 204, sheaths 206, inactive surface through via terminals 208, and active surface through via terminals 210 of surface mounted component structure 200 of FIG. 2 and so the description thereof is not repeated here.

Referring now to FIGS. 12 and 13 together, capacitor structure 1200 includes capacitor plates 1202, 1204 formed on inactive surface 106. Capacitor plate 1202 is connected to an inactive surface though via terminal 208 of a first through via 202. Similarly, capacitor plate 1204 is connected to an inactive surface though via terminal 208 of a second through via 202.

Capacitor plate 1202 and capacitor plate 1204 include fingers 1206A, 1206B, 1206C, 1206D, and fingers 1208A, 1208B, 1208C, 1208D, respectively. Fingers 1206A, 1206B, 1206C, 1206D, collectively first fingers 1206, are interdigitated with fingers 1208A, 1208B, 1208C, 1208D, collectively second fingers 1208, in a direction parallel with inactive surface 106.

Although capacitor plates 1202, 1204 are illustrated and set forth herein as each including four fingers 1206, 1208, in accordance with other embodiments, capacitor plates 1202, 1204 have more or less than four fingers.

As indicated by the dashed lines in FIGS. 12 and 13, in one embodiment, some portions or all of capacitor plates 1202, 1204 extend into electronic component 102. For example, fingers 1206, 1208 extend into electronic component 102 and more particularly extend through inactive surface 106 and into bulk 204 of electronic component 102, e.g., to active surface 104.

In one embodiment, trenches are formed in inactive surface 106 of electronic component 102 and extend at least partially through, or entirely through, electronic component 102. Optionally, these trenches are lined with a dielectric material. Further, these trenches are filled with an electrically conductive material to form fingers 1206, 1208 and generally capacitor plates 1202, 1204.

Figure 13A:
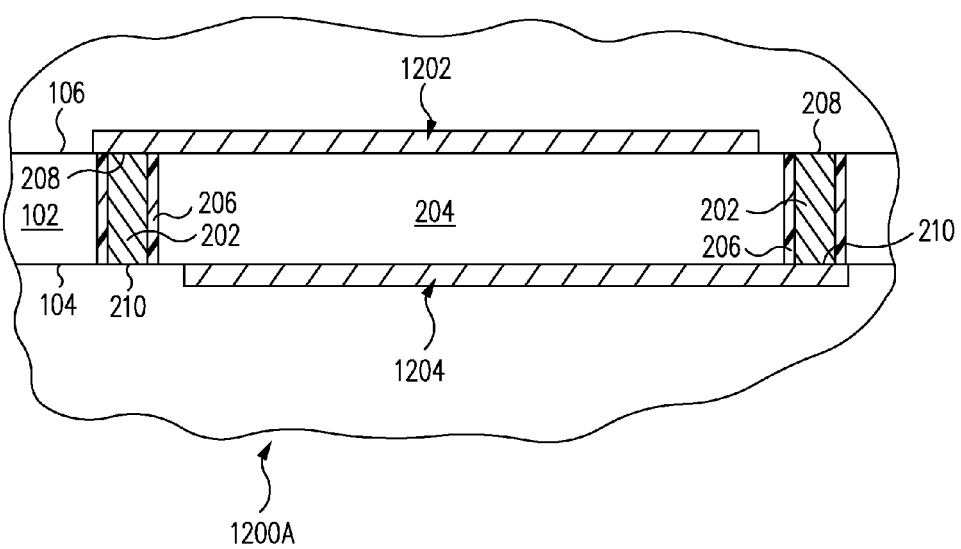
FIG. 13A is a cross-sectional view of a capacitor structure in accordance with another embodiment.

FIG. 13A is a cross-sectional view of a capacitor structure 1200A in accordance with another embodiment. Capacitor structure 1200A of FIG. 13A is similar to capacitor structure 1200 of FIG. 13 and only the significant differences are discussed below.

Referring now to FIG. 13A, in accordance with this embodiment, capacitor plate 1204 is formed on active surface 104. Capacitor plate 1204 is connected to the active surface though via terminal 210 of the first through via 202.

Accordingly, capacitor plate 1202 is separated from capacitor plate 1204 by bulk 204, which forms the dielectric for capacitor structure 1200A, e.g., a top and bottom plate capacitor, in accordance with this embodiment.

Capacitor plates 1202, 1204 are not limited to the particular shapes as illustrated in FIG. 12, but can be solid plates or other shapes.

Figure 14:
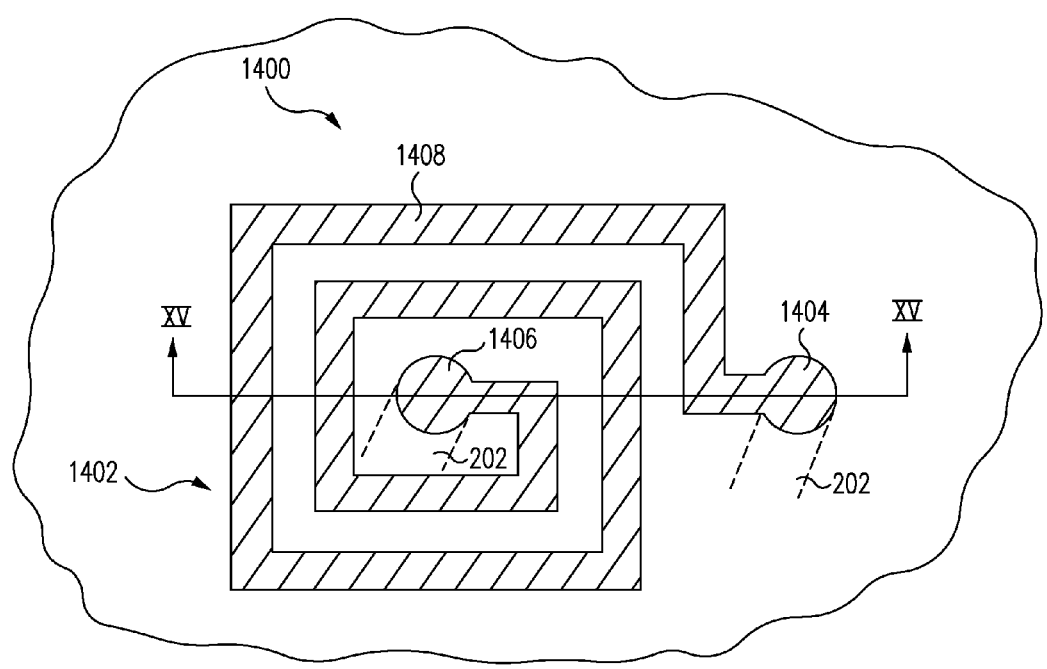
FIG. 14 is a perspective view of an inductor structure of the passive device structure of FIG. 1 in accordance with one embodiment.
Figure 15:
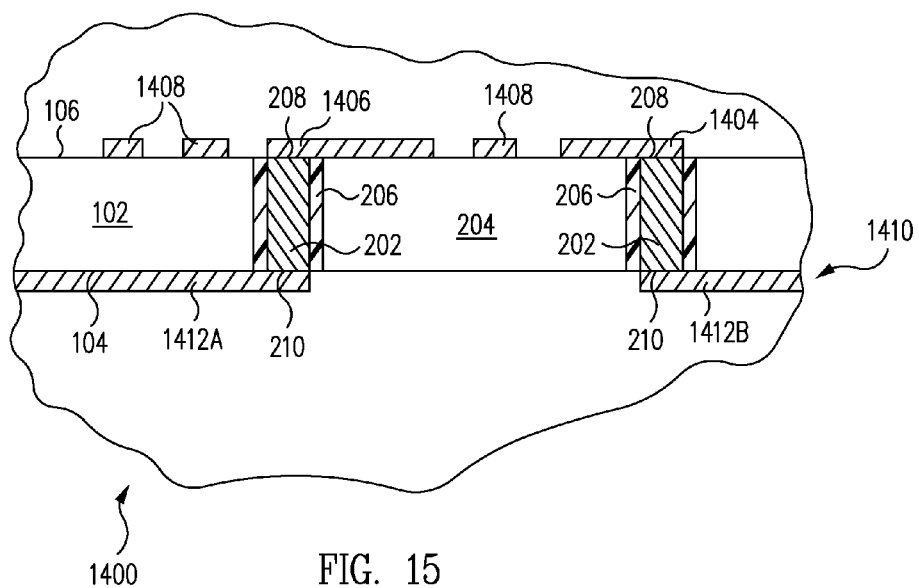
FIG. 15 is a cross-sectional view of the inductor structure of FIG. 14 along the line XV-XV in accordance with one embodiment.

FIG. 14 is a perspective view of an inductor structure 1400 of passive device structure 112 of FIG. 1 in accordance with one embodiment. FIG. 15 is a cross-sectional view of inductor structure 1400 of FIG. 14 along the line XV-XV in accordance with one embodiment.

Referring now to FIGS. 2, 14 and 15 together, through vias 202, active surface 104, inactive surface 106, bulk 204, sheaths 206, inactive surface through via terminals 208, and active surface through via terminals 210 of inductor structure 1400 of FIGS. 14, 15 are similar or identical to through vias 202, active surface 104, inactive surface 106, bulk 204, sheaths 206, inactive surface through via terminals 208, and active surface through via terminals 210 of surface mounted component structure 200 of FIG. 2 and so the description thereof is not repeated here.

Referring now to FIGS. 14 and 15 together, inductor structure 1400 includes an inductor 1402 on inactive surface 106 of electronic component 102. Inductor 1402 is a device that stores energy in the form of a magnetic field created by an electrical current passing through inductor 1402. Inductor 1402 is sometimes called a metal interconnect.

Inductor 1402 includes an outer, e.g., first, terminal 1404 and an inner, e.g., second, terminal 1406. Inductor 1402 spirals inwards, i.e., decreases in radius, from outer terminal 1404 to inner terminal 1406.

Inductor 1402 includes a conductive spiral 1408 between outer terminal 1404 and inner terminal 1406. In accordance at this embodiment, spiral 1408 is a rectangular spiral, e.g., includes a plurality of linear segments connected together. However, in other embodiments, spiral 1408 is non rectangular, e.g., is a smooth curve between outer terminal 1404 and inner terminal 1406.

Inductor 1402 is formed on inactive surface 106. Outer terminal 1404 is connected to inactive surface though via terminal 208 of a first through via 202. Similarly, inner terminal 1406 is connected to inactive surface though via terminal 208 of a second through via 202.

In accordance with this embodiment, inductor structure 1400 further includes a lower circuit pattern 1410 on active surface 104 of electronic component 102. Lower circuit pattern 1410 includes a first trace 1412A and a second trace 1412B. First trace 1412A is connected to active surface through via terminal 210 of the first through via 202. Similarly, second trace 1412B is connected to active surface through via terminal 210 of the second through via 202.

Accordingly, first trace 1412A is electrically connected to inner terminal 1406 by the respective through via 202 and second trace 1412B is electrically connected to outer terminal 1404 also by the respective through via 202.

Although only a single inductor 1402 is illustrated in FIGS. 14 and 15 and discussed above, in other embodiments, two or more inductors are formed and interconnected. An example of two interconnected inductors is illustrated in FIG. 16 and discussed further below.

Figure 16:
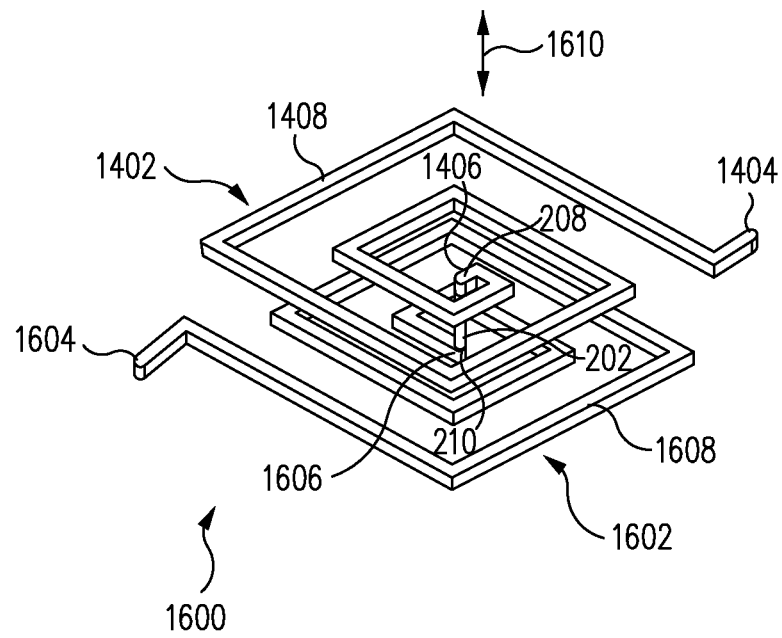
FIG. 16 is a perspective view of an inductor structure of the passive device structure of FIG. 1 in accordance with one embodiment.

FIG. 16 is a perspective view of an inductor structure 1600 of passive device structure 112 of FIG. 1 in accordance with one embodiment. In FIG. 16, electronic component 102 is not illustrated for clarity of presentation.

Inductor structure 1600 of FIG. 16 includes a first inductor 1402 and a second inductor 1602. Inductor 1402 of FIG. 16 is the same as or similar to inductor 1402 of FIGS. 14, 15 and so the discussion is not repeated here.

Referring now to FIGS. 1 and 16 together, inductor 1602 is formed on active surface 104. Inductor 1602 is a device that stores energy in the form of a magnetic field created by an electrical current passing through inductor 1602.

Inductor 1602 includes an outer, e.g., first, terminal 1604 and an inner, e.g., second, terminal 1606. Inductor 1602 spirals inwards, i.e., decreases in radius, from outer terminal 1604 to inner terminal 1606.

Inductor 1602 includes a conductive spiral 1608 between outer terminal 1604 and inner terminal 1606. In accordance at this embodiment, spiral 1608 is a rectangular spiral, e.g., includes a plurality of linear segments connected together. However, in other embodiments, spiral 1608 is non rectangular, e.g., is a smooth curve between outer terminal 1604 and inner terminal 1606.

Inductor 1602 is formed on active surface 104. Inner terminal 1406 of inductor 1402 is connected to an inactive surface though via terminal 208 of a through via 202. Inner terminal 1606 of inductor 1602 is connected to an active surface though via terminal 210 of the same through via 202. Accordingly, inner terminal 1406 of inductor 1402 is connected to inner terminal 1606 of inductor 1602 by the respective through via 202.

In inductor structures 1400, 1600 of FIGS. 14, 15, and 16, the magnetic field created by a current passing though inductors 1402 and/or 1602 is generally perpendicular to active surface 104 and inactive surface 106. Stated another way, inductors 1402 and/or 1602 have an axis 1610 (FIG. 16) perpendicular to active surface 104 and inactive surface 106. In another embodiment such as that set forth below in reference to FIG. 17, a magnetic field created by a current passing through an inductor is generally parallel to active surface 104 and inactive surface 106.

Figure 17:
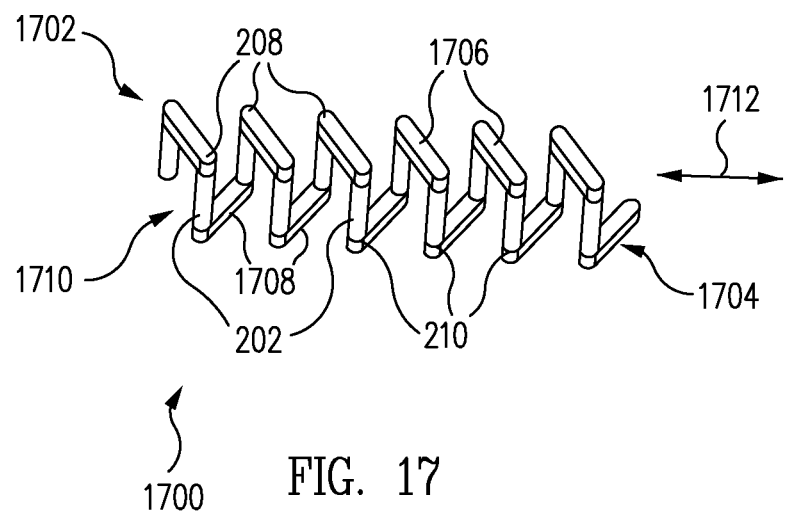
FIG. 17 is a perspective view of an inductor structure of the passive device structure of FIG. 1 in accordance with one embodiment.

FIG. 17 is a perspective view of an inductor structure 1700 of passive device structure 112 of FIG. 1 in accordance with one embodiment. In FIG. 17, electronic component 102 is not illustrated for clarity of presentation.

Referring now to FIGS. 1 and 17 together, inductor structure 1700 includes an upper, e.g., first, circuit pattern 1702, a lower, e.g., second, circuit pattern 1704 and through vias 202.

Through vias 202 are formed of an electrically conductive material in this embodiment. Through vias 202 include inactive surface though via terminals 208 at inactive surface 106 and active surface through via terminals 210 at active surface 104.

Upper circuit pattern 1702 is formed on inactive surface 106 of electronic component 102. Upper circuit pattern 1702 includes electrically conductive upper traces 1706 that connect inactive surface through via terminals 208 of adjacent through vias 202 together.

Similarly, lower circuit pattern 1704 is formed on active surface 104 of electronic component 102. Lower circuit pattern 1704 includes electrically conductive lower traces 1708 that connect active surface through via terminals 210 of adjacent through vias 202 together.

As illustrated in FIG. 17, through vias 202 are connected together in series by traces 1706, 1708 to form an electrically conductive inductor 1710 (e.g., a coil) having an axis 1712 parallel to surfaces 104, 106. Thus, a magnetic field created by a current passing through inductor 1710 is generally parallel to active surface 104 and inactive surface 106.

Figures 18, 19:
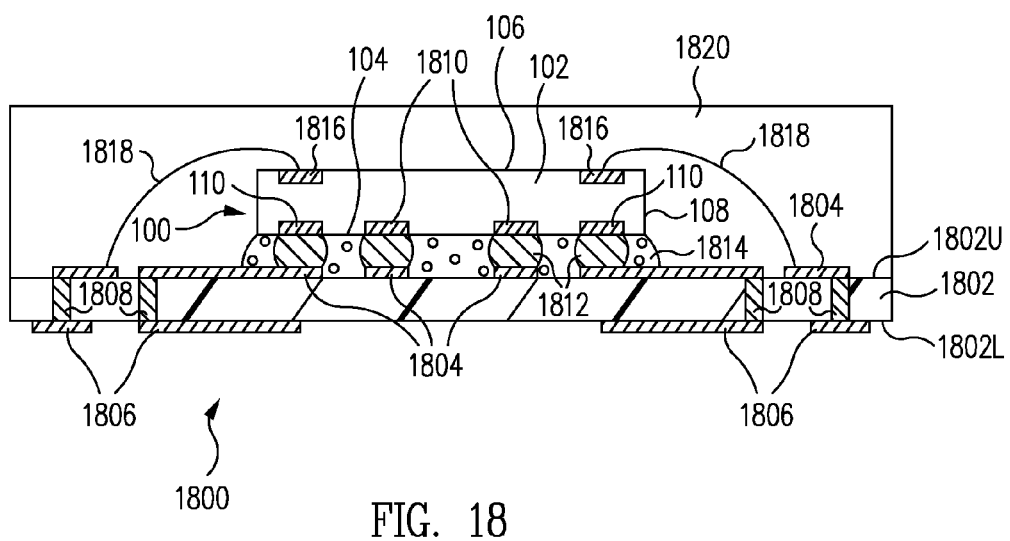
FIG. 18 is a cross-sectional view of an IPD package formed with the IPD structure of FIG. 1 in accordance with one embodiment.
FIG. 19 is a cross-sectional view of an IPD package formed with the IPD structure of FIG. 1 in accordance with another embodiment.

FIG. 18 is a cross-sectional view of an IPD package 1800 formed with IPD structure 100 of FIG. 1 in accordance with one embodiment. Referring now to FIGS. 1 and 18 together, IPD package 1800, sometimes called an electronic component package, includes a substrate 1802 including an upper, e.g., first, surface 1802U and an opposite lower, e.g., second, surface 1802L. Substrate 1802 is a dielectric material such as laminate, ceramic, printed circuit board material, or other dielectric material.

Formed on upper surface 1802U of substrate 1802 are electrically conductive upper, e.g., first, traces 1804, e.g., formed of copper. Formed on lower surface 1802L of substrate 1802 are lower, e.g., second, traces 1806. Lower traces 1806 are electrically connected to upper traces 1804 by electrically conductive vias 1808 extending through substrate 1802 between upper surface 1802U and lower surface 1802L.

Although a particular electrically conductive pathway between upper traces 1804 and lower traces 1806 is described above, other electrically conductive pathways can be formed. For example, contact metallizations can be formed between the various electrical conductors.

Further, instead of straight though vias 1808, in one embodiment, substrate 1802 is a multilayer substrate and a plurality of vias and/or internal traces form the electrical interconnection between upper traces 1804 and lower traces 1806. Further, substrate 1802 can be another type of substrate, such as, for example, a leadframe type substrate. In another embodiment, IPD package 1800 is formed without a substrate, for example, is a Wafer Level Fan Out (WLFO) type package. In light of this disclosure, those of skill in the art will understand that any one of a number of package configurations are possible depending upon the particular application.

In accordance with this embodiment, IPD structure 100 in accordance with any of the embodiments as set forth above includes active surface bond pads 110 and active surface passive device bond pads 1810 on active surface 104. As discussed above, active surface bond pads 110, sometimes called electronic component bond pads 110, provide the input/output terminals for the active devices of electronic component 102 of IPD structure 100.

Active surface passive device bond pads 1810 provide the input/output terminals for passive device structure 112 of IPD structure 100. Illustratively, active surface through via terminals (e.g., see active surface through via terminals 210 of FIGS. 2, 7, 13) and/or terminals of a circuit pattern (e.g., see lower circuit pattern 414, 914, 1124, 1410, 1710 of FIGS. 4, 6, 9, 11, 15, 17 and terminals 1604, 1606 of FIG. 16) form active surface passive device bond pads 1810.

IPD structure 100 is mounted in a flip chip configuration in accordance with this embodiment such that active surface 104 faces towards substrate 1802. More particularly, flip chip bumps 1812, e.g., solder, form the physical and electrical connections between active surface bond pads 110, 1810 and upper traces 1804, e.g., bond fingers thereof. Optionally, an underfill 1814 is applied between active surface 104 of IPD structure 100 and upper surface 1802U of substrate 1802 and encloses and protects flip chip bumps 1812.

Optionally, inactive surface passive device bond pads 1816 are formed on inactive surface 106 of IPD structure 100. Inactive surface passive device bond pads 1816 also provide the input/output terminals for passive device structure 112 of IPD structure 100. Illustratively, inactive surface through via terminals (e.g., see inactive surface through via terminals 208 of FIGS. 2, 7, 13) and/or terminals of a circuit pattern (e.g., see upper circuit pattern 412, 912, 1120, 1702 of FIGS. 4, 6, 9, 11, 17 and terminals 1404, 1406 of FIGS. 14, 16) form inactive surface passive device bond pads 1816.

Inactive surface passive device bond pads 1816 are electrically connected to upper traces 1804, e.g., bond fingers thereof, by electrically conductive bond wires 1818. Optionally, IPD structure 100 and bond wires 1818 are enclosed in a package body 1820, e.g., an encapsulant.

In accordance with various embodiments, passive device structure 112 is provided with: (1) active surface passive device bond pads 1810 on active surface 104 only; (2) inactive surface passive device bond pads 1816 on inactive surface 106 only; or (3) active surface passive device bond pads 1810 on active surface 104 and inactive surface passive device bond pads 1816 on inactive surface 106. Accordingly, passive device structure 112 is readily configured into a flip chip configuration, a wirebond configuration, or a combined flip chip/wirebond configuration.

FIG. 19 is a cross-sectional view of an IPD package 1900 formed with IPD structure 100 of FIG. 1 in accordance with another embodiment. Substrate 1802, upper traces 1804, lower traces 1806, and vias 1808 of IPD package 1900 of FIG. 19 are similar or identical to substrate 1802, upper traces 1804, lower traces 1806, and vias 1808 of IPD package 1800 of FIG. 18 and so the description thereof is not repeated here.

Referring now to FIGS. 1 and 19 together, in accordance with this embodiment, IPD structure 100 is mounted in a wirebond configuration such that active surface 104 faces away from substrate 1802. Inactive surface 106 is mounted to upper surface 1802U of substrate 1802 with an adhesive 1902, sometimes called a die attach adhesive.

Active surface bond pads 110, 1810 on active surface 104 are electrically connected to upper traces 1804, e.g., bond fingers thereof, by electrically conductive bond wires 1904. Optionally, IPD structure 100 and bond wires 1904 are enclosed in a package body 1906, e.g., an encapsulant.

Optionally, IPD structure 100 includes inactive surface passive device bond pads 1816 on inactive surface 106. Flip chip bumps 1908, e.g., solder, form the physical and electrical connections between inactive surface passive device bond pads 1816 and upper traces 1804, e.g., bond fingers thereof. Optionally, adhesive 1902 (which functions as an underfill in accordance with this example) is applied between inactive surface 106 of IPD structure 100 and upper surface 1802U of substrate 1802 and encloses and protects flip chip bumps 1908.

In accordance with various embodiments, passive device structure 112 is provided with: (1) active surface passive device bond pads 1810 on active surface 104 only; (2) inactive surface passive device bond pads 1816 on inactive surface 106 only; or (3) active surface passive device bond pads 1810 on active surface 104 and inactive surface passive device bond pads 1816 on inactive surface 106. Accordingly, passive device structure 112 is readily configured into a flip chip configuration, a wirebond configuration, or a combined flip chip/wirebond configuration.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. An integrated passive device (IPD) structure comprising:
   a passive device support structure comprising:
      a first surface; and
      an opposite second surface; and
   a passive device structure comprising:
      a first through passive device structure extending through the passive device support structure between the first surface and the second surface, wherein the first through passive device structure comprises at least one resistor;
      a second through passive device structure extending through the passive device support structure between the first surface and the second surface, wherein the second through passive device structure comprises at least one resistor; and
      a first surface passive device structure coupled to respective ends of the first and second through passive device structures to form a resistor that comprises the first through passive device structure, the first surface passive device structure, and the second through passive device structure, the first surface passive device structure being further coupled to the first surface.

2. The IPD structure of claim 1 wherein the first surface is an active surface of the passive device support structure, the active surface comprising active devices formed therein, wherein the passive device support structure further comprises bond pads on the active surface, the bond pads providing input/output terminals for the active devices.

3. The IPD structure of claim 2 wherein the passive device structure further comprises active surface passive device bond pads on the active surface, the active surface passive device bond pads providing input/output terminals for the passive device structure.

4. The IPD structure of claim 2 wherein the second surface is an inactive surface of the passive device support structure, the passive device structure further comprises inactive surface passive device bond pads on the inactive surface, the inactive surface passive device bond pads providing input/output terminals for the passive device structure.

5. The IPD structure of claim 1 wherein the first surface is an inactive surface of the passive device support structure.

6. The IPD structure of claim 1 wherein the passive device structure further comprises a second surface passive device structure coupled to the first through passive device structure, the second surface passive device structure being further coupled to the second surface.

7. The IPD structure of claim 1 wherein the first through passive device structure comprises electrically conductive through vias.

8. The IPD structure of claim 7 wherein the first surface passive device structure comprises:
   a circuit pattern coupled to the through vias, the circuit pattern comprising lands; and
   an electronic component coupled to the lands.

9. The IPD structure of claim 7 wherein the first surface passive device structure comprises:
   a resistor comprising terminals coupled to the through vias.

10. The IPD structure of claim 7 wherein the first surface passive device structure comprises:
    a first capacitor plate coupled to a first through via of the through vias; and
    a second capacitor plate coupled to a second through via of the through vias.

11. The IPD structure of claim 7 wherein a first set of the through vias form a first capacitor plate of a capacitor and a second set of the through vias form a second capacitor plate of the capacitor.

12. The IPD structure of claim 7 wherein the first surface passive device structure comprises:
    a first inductor comprising terminals coupled to the through vias.

13. The IPD structure of claim 12 further comprising a second inductor coupled to the second surface, the second inductor comprising terminals coupled to the through vias.

14. The IPD structure of claim 7 wherein the first surface passive device structure comprises:
    a first circuit pattern, the passive device structure further comprising a second circuit pattern coupled to the second surface, the first circuit pattern and the second circuit pattern coupling the through vias together in series to form an inductor.

15. The IPD structure of claim 1 wherein the first surface passive device structure comprises:
 a first circuit pattern, the passive device structure further comprising a second circuit pattern coupled to the second surface, the first circuit pattern and the second circuit pattern coupling the at least one resistor of the first through passive device structure together.

16. The IPD structure of claim 1, wherein the passive device structure further comprises:
 a third through passive device structure extending through the passive device support structure between the first surface and the second surface, wherein the third through passive device structure comprises at least one resistor; and
 a second surface passive device structure coupled to the second and third through passive device structures to form a resistor that comprises the first through passive device structure, the first surface passive device structure, the second through passive device structure, the second surface passive device structure, and the third through passive device structure, the first surface passive device structure being further coupled to the second surface.

\* \* \* \* \*

UNITED STATES PATENT AND TRADEMARK OFFICE
CERTIFICATE OF CORRECTION

| | | |
|---|---|---|
| PATENT NO. | : 8,791,501 B1 | Page 1 of 1 |
| APPLICATION NO. | : 12/959851 | |
| DATED | : July 29, 2014 | |
| INVENTOR(S) | : Fuentes et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 629 days.

Signed and Sealed this
Fifteenth Day of December, 2015

Michelle K. Lee
*Director of the United States Patent and Trademark Office*